United States Patent
Joo

(10) Patent No.: US 7,157,334 B2
(45) Date of Patent: Jan. 2, 2007

(54) METHOD OF MANUFACTURING FLASH MEMORY DEVICE

(75) Inventor: Kwang Chul Joo, Kyungki-Do (KR)

(73) Assignee: Hynix Semiconductor Inc., Incheon-si (KR)

( * ) Notice: Subject to any disclaimer, the term of this patent is extended or adjusted under 35 U.S.C. 154(b) by 0 days.

(21) Appl. No.: 11/146,168

(22) Filed: Jun. 6, 2005

(65) Prior Publication Data

US 2006/0073660 A1    Apr. 6, 2006

(30) Foreign Application Priority Data

Oct. 1, 2004    (KR)    .................. 10-2004-0078292

(51) Int. Cl.
*H01L 21/8247*    (2006.01)
*H01L 21/336*    (2006.01)

(52) U.S. Cl. ............... 438/260; 438/264; 257/317; 257/321; 257/E21.681

(58) Field of Classification Search ........ 438/260, 438/264; 257/317, 321, E21.681
See application file for complete search history.

(56) References Cited

U.S. PATENT DOCUMENTS

| | | | | |
|---|---|---|---|---|
| 4,747,367 A | * | 5/1988 | Posa | 118/715 |
| 5,089,867 A | * | 2/1992 | Lee | 257/316 |
| 5,753,559 A | * | 5/1998 | Yew et al. | 438/398 |
| 5,972,750 A | * | 10/1999 | Shirai et al. | 438/257 |
| 6,259,130 B1 | * | 7/2001 | Wu | 257/314 |
| 6,297,095 B1 | * | 10/2001 | Muralidhar et al. | 438/257 |
| 6,396,099 B1 | * | 5/2002 | Joo et al. | 257/315 |
| 6,444,545 B1 | * | 9/2002 | Sadd et al. | 438/503 |
| 6,703,708 B1 | * | 3/2004 | Werkhoven et al. | 257/751 |
| 6,759,296 B1 | * | 7/2004 | Kwak et al. | 438/257 |
| 6,831,315 B1 | * | 12/2004 | Raaijmakers et al. | 257/296 |
| 2002/0076883 A1 | * | 6/2002 | Tseng | 438/264 |
| 2003/0116795 A1 | * | 6/2003 | Joo | 257/296 |
| 2003/0119334 A1 | * | 6/2003 | Kwak et al. | 438/775 |
| 2003/0201489 A1 | * | 10/2003 | Huang | 257/315 |
| 2004/0011279 A1 | * | 1/2004 | Joo | 117/88 |
| 2004/0152260 A1 | * | 8/2004 | Rabkin et al. | 438/257 |

FOREIGN PATENT DOCUMENTS

| | | |
|---|---|---|
| KR | 1019940006703 | 7/1994 |
| KR | 2002-0007862 | 1/2002 |

OTHER PUBLICATIONS

S. Wolf and R.N. Tauber, Silicon Processing, 1986, Lattice Press, vol. 1, pp. 191-194 and 514-518.*
Official Action in Counterpart Korean Application No. 2004-78292 dated Jan. 31, 2006.

* cited by examiner

*Primary Examiner*—Bradley K. Smith
*Assistant Examiner*—Steven J. Fulk
(74) *Attorney, Agent, or Firm*—Marshall, Gerstein & Borun LLP

(57) ABSTRACT

A method of manufacturing a flash memory device, including the steps of forming a floating gate electrode that is a doped polysilicon film on a semiconductor substrate, forming a polysilicon layer in the pattern of HSG on the doped polysilicon film, conducting a nitrifying process after forming the HSG polysilicon layer, forming an $Al_2O_3$ film on the resultant structure treated by the nitrifying process, and forming a control gate electrode on the $Al_2O_3$ film.

12 Claims, 2 Drawing Sheets

METHOD OF MANUFACTURING FLASH MEMORY DEVICE

BACKGROUND

1. Field of the Invention

The present invention relates to a method of manufacturing a semiconductor device and specifically, to a method of forming a dielectric layer in a flash memory device.

2. Discussion of Related Art

In general, a dielectric film used in a flash memory device is formed between a floating gate and a control gate. However, recently, it is being required of providing a technique to form a dielectric film so as to assure the charging capacitance of the floating gate electrode in need for a new generation flash memory device.

SUMMARY OF THE INVENTION

The present invention is directed to provide a method of manufacturing flash memory device so as to assure the charging capacitance for a floating gate electrode thereof.

An aspect the present invention is to provide a method of manufacturing a flash memory device, the method comprising the steps of: forming a tunnel oxide film on a semiconductor substrate and forming a floating gate electrode of a doped polysilicon film; forming a polysilicon layer of hemispherical grain (HSG) pattern on the doped polysilicon film; conducting nitrification for the substrate after forming the HSG polysilicon layer; forming an $Al_2O_3$ film on the resultant structure; and forming a control gate electrode on the $Al_2O_3$ film.

Preferably, the nitrification proceeds with annealing the substrate in the atmosphere of nitrogen at temperature of 200 through 400° C., or with treatment by rapid thermal nitrification (RTN) in an atmosphere of nitrogen at temperature of 750 through 950° C. for 30 seconds through 30 minutes. The atmosphere of nitrogen is formed with one among $NH_3$, compound gas of $N_2$ and $H_2$, $N_2O$.

Preferably, the nitrification is carried out with HF compound including HF vapor or HF solution. The method further comprises the step of treating boundary surfaces with compound of $NH_4OH$ and $H_2SO_4$ solution during the nitrification with the HF compound.

Preferably, the Al2O3 film is formed by the sequential steps of: forming a first amorphous $Al_2O_3$ film about 20 Å by means of chemical vapor of Al together with excessive $O_2$ reaction gas with controlling gas phase reaction in an LPCVD chamber at temperature of 300 through 600° C.; performing a first crystallization of the first amorphous $Al_2O_3$ film by a first annealing the substrate in the atmosphere of $N_2O$ at temperature of 750 through 950° C.; forming a second amorphous $Al_2O_3$ film in predetermined thickness on the first amorphous $Al_2O_3$ film after inducing the first crystallization; and forming second amorphous $Al_2O_3$ film in predetermined thickness performing a second crystallization of the first amorphous $Al_2O_3$ film by a second annealing the substrate in the atmosphere of $N_2O$ at temperature of 750 through 950° C. The chemical vapor Al is obtained from supplying $Al(OC_2H_5)_3$ compound to an evaporator or an evaporation tube through a flow controller and then evaporating the $Al(OC_2H_5)_3$ compound in temperature of 150 through 300° C.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Figure 1:
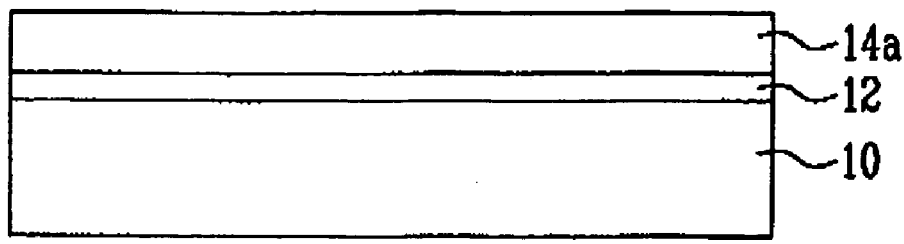
FIGS. 1 through 5 are sectional diagrams illustrating processing steps by a method of manufacturing a flash memory device in accordance with a preferred embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numerals refer to like elements throughout the specification. It will also be understood that when a layer is referred to as being "on" another layer or substrate, it can be directly on the other layer or substrate, or intervening layers may also be present.

FIGS. 1 through 5 are sectional diagrams illustrating processing steps by a method of forming a dielectric layer in a flash memory device in accordance with a preferred embodiment of the present invention.

Referring to FIG. 1, a tunnel oxide film 12 and a floating gate electrode 14a as the bottom electrode storing charges are formed on a semiconductor substrate 10. The floating gate electrode 14a is formed with a doped polysilicon film.

Figure 2:
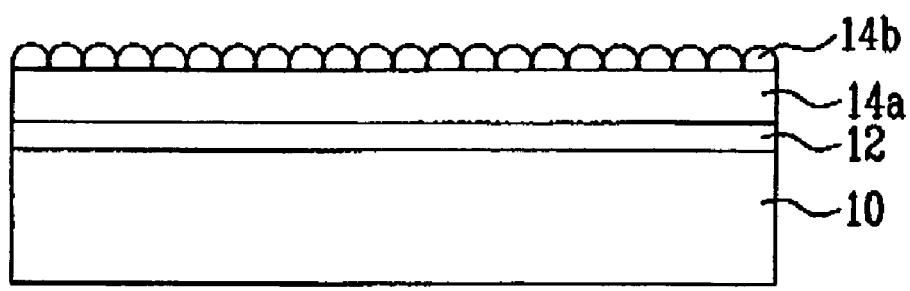

Referring to FIG. 2, a polysilicon layer 14b in the pattern of hemispherical grain (HSG) is formed on the floating gate electrode 14a acting as the bottom electrode, being used as an electrode storing charges.

Figure 3:
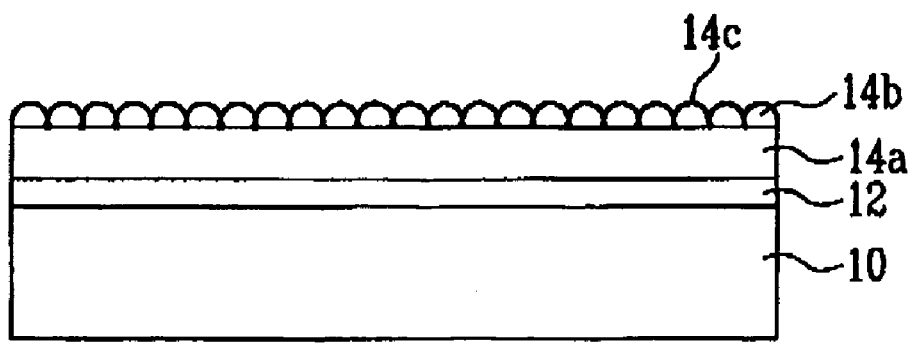

Referring to FIG. 3, a nitrification process is conducted on the polysilicon layer 14b of HSG, thereby forming a nitrified HSG polysilicon film 14c.

The nitrification process is carried out to prevent a low-k dielectric oxide film ($SiO_2$) from being formed on a boundary surface of the polysilicon layer and an amorphous $Al_2O_3$ dielectric film during the subsequent step to deposit the amorphous $Al_2O_3$ dielectric on the HSG polysilicon layer 14b.

The nitrification process proceeds with annealing the substrate in the atmosphere of $NH_3$ (or $N_2/H_2$, $N_2O$) gas at temperature of 200 through 400° C. by means of plasma just before depositing the amorphous $Al_2O_3$ dielectric film, or with treatment by rapid thermal nitrification (RTN) in temperature of 750 through 950° C. for 30 seconds through 30 minutes.

Further, the nitrification process is carried out with using HF compound, i.e., HF vapor or HF solution. And, the $Al_2O_3$ film is formed without delay after depositing a silicon nitride film $Si_3N_4$ in the thickness under 10 Å.

Meantime, during the nitrification process with the HF compound, it further conducts a cleaning step for the boundary surfaces by means of compound such as $NH_4OH$ solution and $N_2SO_4$ solution for the purpose of cleaning the boundary surfaces and enhancing uniformity thereof before and after the nitrification process.

Figure 4:
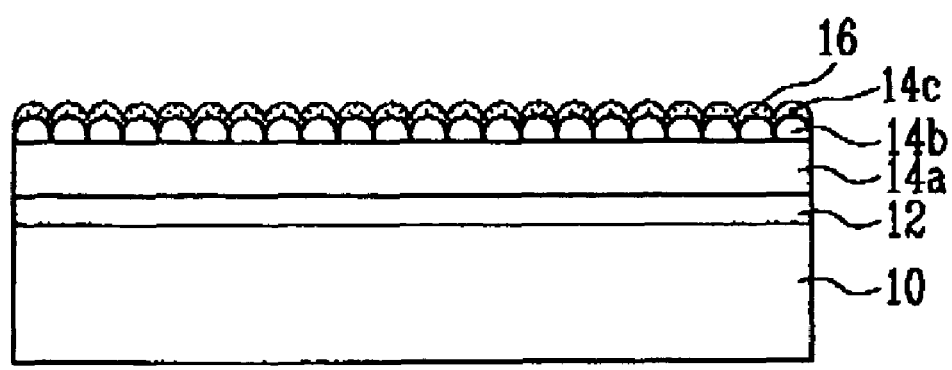

Referring to FIG. 4, an $Al_2O_3$ film 16 is formed on the resultant structure in which the nitrified HSG polysilicon film 14c.

In forming the $Al_2O_3$ film 16, first, an amorphous film about 20 Å is formed by means of chemical vapor, which is made as described later, together with $O_2$ gas while controlling gas phase reaction in an LPCVD chamber at temperature of 300 through 600° C. Second, after inducing crystallization by annealing the substrate for 30 through 600 seconds in the atmosphere of $N_2O$ at temperature of 750 through 950° C. by way of RTP, an amorphous $Al_2O_3$ film is deposited in the desired thickness. And then, it induces single crystallization by annealing the substrate for 30 through 600 seconds in the atmosphere of $N_2O$ at temperature of 750 through 950° C. by way of RTP, completely forming the $Al_2O_3$ film 16.

The chemical vapor containing ingredient of Al is obtained from supplying compound such as $Al(OC_2H_5)_3$ of a definite amount to an evaporator or an evaporation tube through a flow control apparatus such as a mass flow controller (MFC) and then evaporating the Al compound by a definite amount in temperature of 150 through 300° C.

Figure 5:
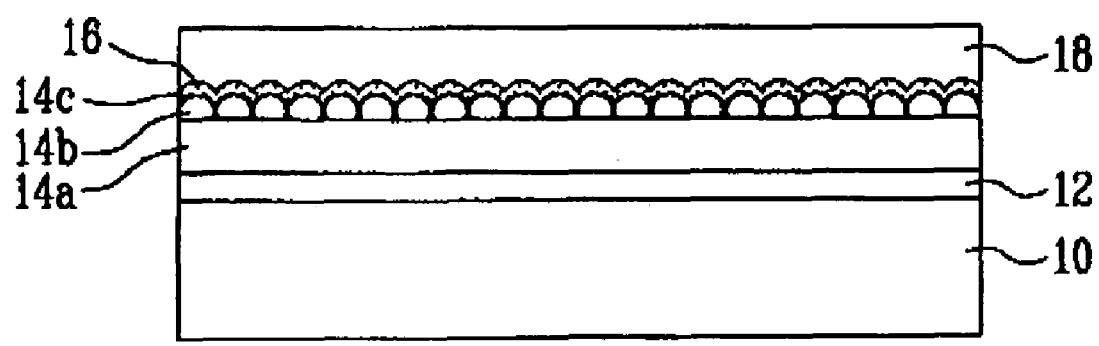

Referring to FIG. 5, after depositing a doped polysilicon film on the entire surface of the resultant structure where the $Al_2O_3$ film 16 is formed, a control gate electrode 18 as the top electrode is formed by way of a photolithography process. As a result, a cell transistor of a flash memory device is completely formed.

If the $Al_2O_3$ is utilized as a dielectric film at the cell transistor of the flash memory device, a dielectric factor ($\epsilon$) thereof becomes higher than that of oxide-nitride-oxide (ONO) film ($\epsilon$ of the $Al_2O_3$ film is 9.3 and $\epsilon$ of the ONO film is 4 through 5). Thus, it is possible to obtain higher charging capacitance.

Further, as the chemical bonding structure of the $Al_2O_3$ film is more stabilized than that of the conventional $Ta_2O_3$, it is possible to effectively control oxidation at boundary surfaces between the top and bottom electrodes during the first crystallization step. As a result, the thickness of its equivalent oxide film can be lowered than that of the ONO film or the $Ta_2O_5$ film, assuring larger charging capacitance.

And, from using the $Al_2O_3$ film for reducing the rate of leakage current and obtaining larger charging capacitance, there is no need of front and rear processes such as a natural oxide removal process and an ONO oxidation process.

In particular, since the $Al_2O_3$ film is structured of perovskite-type (ABO3) that has good mechanical and electrical strength, it is stable more than the ONO or $Ta_2O_5$ film in structure and endurable against an electrical stress surged from the external.

Further, if structural boding power in the $Al_2O_3$ film is strengthened through the inducement to the single crystallization by way of high temperature thermal treatment, the single crystallized $Al_2O_3$ film has a higher dielectric factor relative to the amorphous film as well as preventing physical and chemical deterioration thereof. Thus, it is possible to obtain a high quality $Al_2O_3$ film with advanced electrical characteristic.

Moreover, the single crystallized $Al_2O_3$ film is effective in obtaining a high breakdown voltage because of its good electrical strength by the material of itself, has good resistance against oxidation, and has uniformity at boundary surfaces, so that the rate of leakage current thereof is lowered relative to the $Ta_2O_5$ film.

Therefore, there is no need of a double or triple structured floating gate to enlarge an area of the charge storing electrode, and it is possible for the floating gate to obtain enough charging capacitance even with a stacked structure formed by simple processes even like the present. Thus, a product cost may be cut down because of the smaller processing steps and the shorter time for a unit processing step.

As described above, the method of the present invention is effective in providing larger charging capacitance for a floating gate electrode of a flash memory device by utilizing the $Al_2O_3$ film as a dielectric film of a cell transistor in the flash memory device.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of manufacturing a flash memory device, the method comprising the steps of:
   forming a tunnel oxide film on a semiconductor substrate and forming a floating gate electrode with a doped polysilicon film on the tunnel oxide film;
   forming a hemispherical grain (HSG) polysilicon layer having an HSG pattern an the doped polysilicon film;
   conducting nitrification on the (HSG) polysilicon layer, thereby forming a nitrified HSG polysilicon film;
   forming an $Al_2O_3$ film on the nitrified HSG polysilicon film; and
   forming a control gate electrode on the $Al_2O_3$ film;
   wherein the $Al_2O_3$ film is formed by the sequential steps of;
   forming an amorphous $Al_2O_3$ film on the nitrified HSG polysilicon film; and
   performing a crystallization on the amorphous $Al_2O_3$ film.

2. The method as set forth in claim 1, wherein the nitrification proceeds with annealing the substrate in an atmosphere of nitrogen at a temperature of 200° C. through 400° C. or with treatment by rapid thermal nitrification (RTN) in an atmosphere of nitrogen at a temperature of 750° C. through 950° C. for a time of 30seconds to 30 minutes.

3. The method as set forth in claim 2, wherein the atmosphere of nitrogen is formed with one of $NH_3$, a mixed gas of $N_2$ and $H_2$, and $N_2O$.

4. The method as set forth in claim 1, wherein the nitrification is carded out with an HF compound selected from the group consisting of HF vapor and an HF solution.

5. The method as set forth in claim 4, further comprising the step of treating boundary surfaces with a compound selected from the group consisting of a $NH_4OH$ solution and an $H_2SO_4$ solution during the nitrification with the HF compound.

6. A method of manufacturing flash memory device, the method comprising the steps of;
   forming a tunnel oxide film on a semiconductor substrate and forming a floating gate electrode with a doped polysilicon film on a tunnel oxide film;
   forming a hemispherical grain (HSG) polysilicon lager having an HSG pattern on the doped polysilicon film;
   conducting nitrification on the HSG polysilicon layer, thereby forming a nitrified HSG polysilicon film;
   forming an $Al_2O_3$ film on the nitrified HSG polysilicon film; and
   forming a control gate electrode on the $Al_2O_3$ film;
   wherein the $Al_2O_3$ film is formed by the sequential steps of;
   forming a first amorphous $Al_2O_3$ film having a thickness of about 20Å by means of chemical vapor of Al together with excess $O_2$ reaction gas by a gas phase reaction in a low-pressure chemical vapor deposition (LPCVD) chamber at a temperature of 300° C. through 600° C.;

performing a first crystallization of the first amorphous $Al_2O_3$ film by a first annealing of the substrate in an atmosphere of $N_2O$ at a temperature of 750° C. through 950° C.;

forming a second amorphous $Al_2O_3$ film in predetermined thickness on the first amorphous $Al_2O_3$ film after inducing the first crystallization; and performing a second crystallization of the first amorphous $Al_2O_3$ film by a second annealing of the substrate in the atmosphere of $N_2O$ at a temperature of 750° C. through 950° C.

7. The method as set forth in claim 6, wherein the chemical vapor Al is obtained by supplying an $Al(OC_2H_5)_3$ compound to an evaporator or an evaporation tube through a flow controller and then evaporating the $Al(OC_2H_5)_3$ compound at a temperature of 150° C. through 300° C.

8. The method as set forth in claim 1, wherein the nitrification forms a silicon nitride film having a thickness less than 10Å.

9. The method as set forth in claim 6, wherein the first or second annealing is performed by way of RTP.

10. The method as set forth in claim 9, wherein the first or second annealing is performed for a time of 30 seconds to 600 seconds.

11. The method as set forth in claim 6, wherein the first or second annealing is performed by using a furnace.

12. The method as set forth in claim 11, wherein the first or second annealing is performed for a time of 10 seconds to 30 minutes.

* * * * *